United States Patent
Somei

(10) Patent No.: US 11,412,111 B2
(45) Date of Patent: Aug. 9, 2022

(54) IMAGE SENSOR MOUNTING BOARD, IMAGING DEVICE, AND IMAGING MODULE

(71) Applicant: KYOCERA Corporation, Kyoto (JP)

(72) Inventor: Yasunobu Somei, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 213 days.

(21) Appl. No.: 16/758,993

(22) PCT Filed: Oct. 24, 2018

(86) PCT No.: PCT/JP2018/039471
§ 371 (c)(1),
(2) Date: Apr. 24, 2020

(87) PCT Pub. No.: WO2019/082923
PCT Pub. Date: May 2, 2019

(65) Prior Publication Data
US 2020/0344384 A1 Oct. 29, 2020

(30) Foreign Application Priority Data

Oct. 26, 2017 (JP) .............................. JP2017-206912

(51) Int. Cl.
*H04N 5/225* (2006.01)
*H01L 27/146* (2006.01)
*H05K 1/18* (2006.01)

(52) U.S. Cl.
CPC ..... *H04N 5/2253* (2013.01); *H01L 27/14618* (2013.01); *H01L 27/14636* (2013.01); *H05K 1/183* (2013.01); *H05K 1/184* (2013.01)

(58) Field of Classification Search
CPC ............ H04N 5/2253; H01L 27/14618; H01L 27/14636; H01L 27/14625; H05K 1/183; H05K 1/184
See application file for complete search history.

(56) References Cited

U.S. PATENT DOCUMENTS

| | | | |
|---|---|---|---|
| 11,102,384 B2 * | 8/2021 | Wang | H04N 5/2253 |
| 2003/0223008 A1 * | 12/2003 | Kim | H01L 31/0203 257/E31.127 |
| 2009/0033790 A1 * | 2/2009 | Lin | H04N 5/2254 348/374 |
| 2015/0326766 A1 * | 11/2015 | Czepowicz | G03B 17/12 348/360 |
| 2017/0104022 A1 | 4/2017 | Okamura et al. | |

FOREIGN PATENT DOCUMENTS

| | | |
|---|---|---|
| EP | 2249167 A1 | 11/2010 |
| EP | 2814063 A1 | 12/2014 |
| JP | 2005-191448 A | 7/2005 |
| JP | 2006-229043 A | 8/2006 |

(Continued)

*Primary Examiner* — Albert H Cutler
(74) *Attorney, Agent, or Firm* — Volpe Koenig

(57) ABSTRACT

An image sensor mounting board includes a first substrate and a second substrate. The first substrate has an upper surface with a recess and includes an organic material. The second substrate is located in the recess on the first substrate, has an upper surface on which an image sensor is mountable, and includes an inorganic material.

15 Claims, 18 Drawing Sheets

(56) References Cited

FOREIGN PATENT DOCUMENTS

| | | | |
|---|---|---|---|
| JP | 2007-306282 | A | 11/2007 |
| JP | 2008245244 | * | 10/2008 |
| JP | 2014-029947 | A | 2/2014 |
| JP | 2016-122978 | A | 7/2016 |
| JP | 2017-168567 | A | 9/2017 |
| WO | 2013/118501 | A1 | 8/2013 |
| WO | 2015/199134 | A1 | 12/2015 |

* cited by examiner

IMAGE SENSOR MOUNTING BOARD, IMAGING DEVICE, AND IMAGING MODULE

FIELD

The present invention relates to an image sensor mounting board on which an image sensor, such as a charge-coupled device (CCD) or a complementary metal-oxide semiconductor (CMOS) device, is mountable and to an imaging device and an imaging module.

BACKGROUND

A known image sensor mounting board includes a substrate formed from an organic material. Also, a known imaging device and a known imaging module include an image sensor and an electronic component mounted on such an image sensor mounting board (refer to Japanese Unexamined Patent Application Publication No. 2017-168567).

The image sensor mounting board described in Japanese Unexamined Patent Application Publication No. 2017-168567 includes a substrate formed from an organic material having an upper surface on which an image sensor is mountable. However, an organic material can deform easily under heat. With the technique described in Patent Literature 1, the substrate that directly receives an image sensor is formed from an organic substrate and may warp or deform under heat generated during mounting or during use of the image sensor. This may cause misalignment between the optical axis of light toward the image sensor and the optical axis of the lens.

BRIEF SUMMARY

An image sensor mounting board according to an aspect of the present invention includes a first substrate and a second substrate. The first substrate has an upper surface with a recess and includes an organic material. The second substrate is located in the recess on the first substrate, has an upper surface on which an image sensor is mountable, and includes an inorganic material.

DETAILED DESCRIPTION

Structures of Image Sensor Mounting Board, Imaging Device, and Imaging Module

Embodiments of the present invention will now be described by way of example with reference to the drawings. In the embodiments described below, an imaging device includes an image sensor mounted on an image sensor mounting board. An imaging module includes an imaging device and a housing located at an upper surface of the imaging device. The image sensor mounting board, the imaging device, and the imaging module are herein defined using the orthogonal xyz coordinate system for ease of explanation, with their surfaces being defined by xy-directions, their thickness direction being z-direction, and an image sensor being mounted to face upward, although they may actually have any faces being upward or downward.

Figure 1:
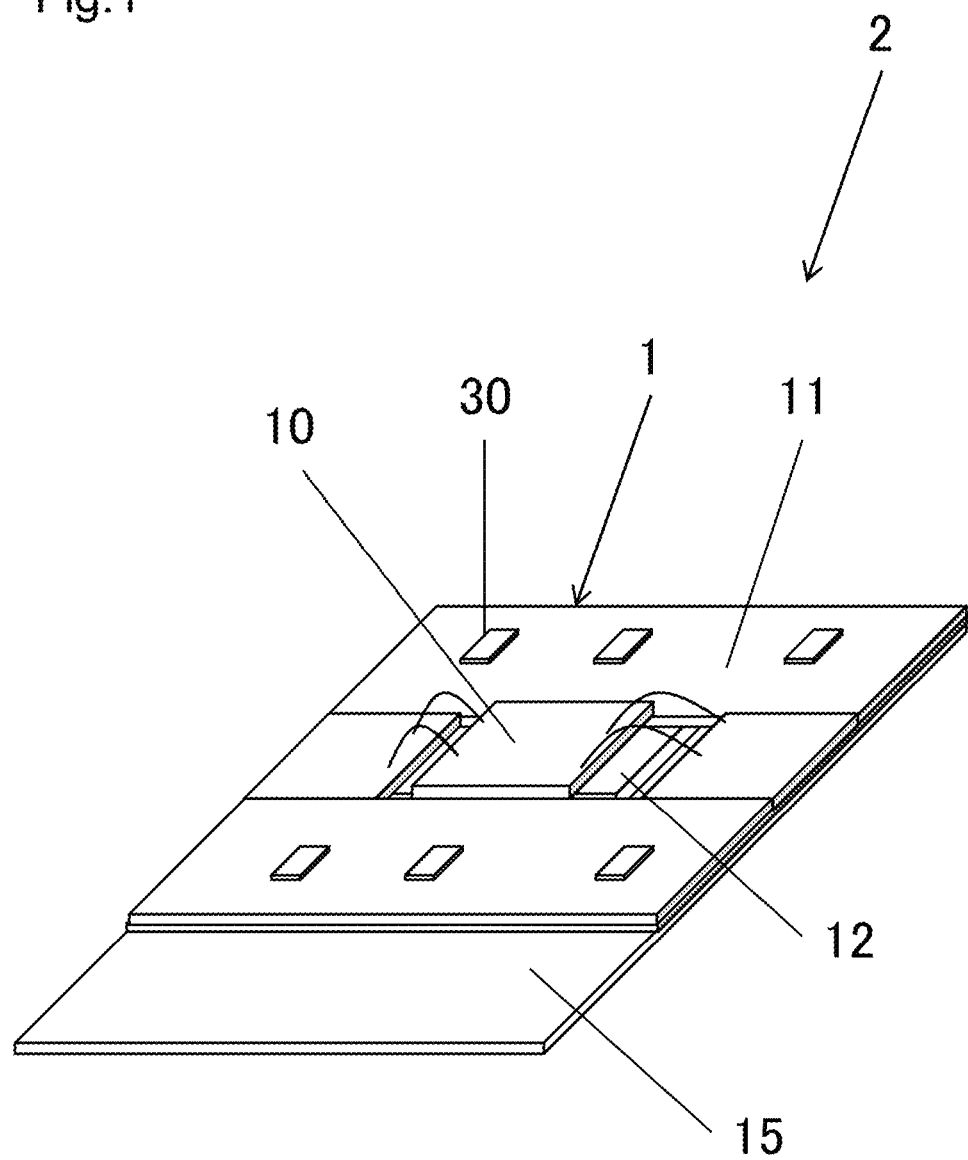
FIG. 1 is a perspective view of an imaging device according to an embodiment of the present invention.
Figure 2:
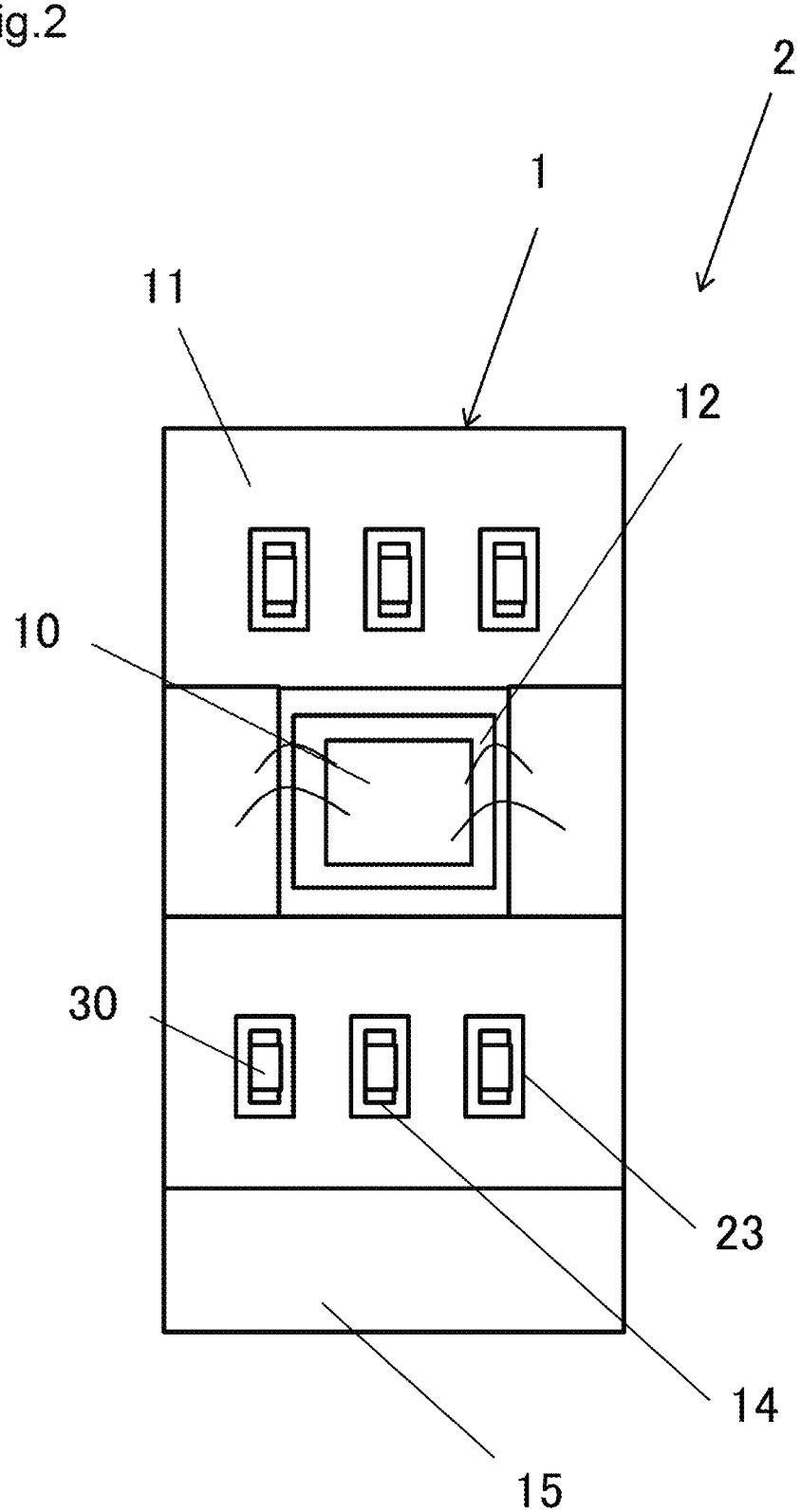
FIG. 2 is a top view of the imaging device according to the embodiment of the present invention.
Figure 3:
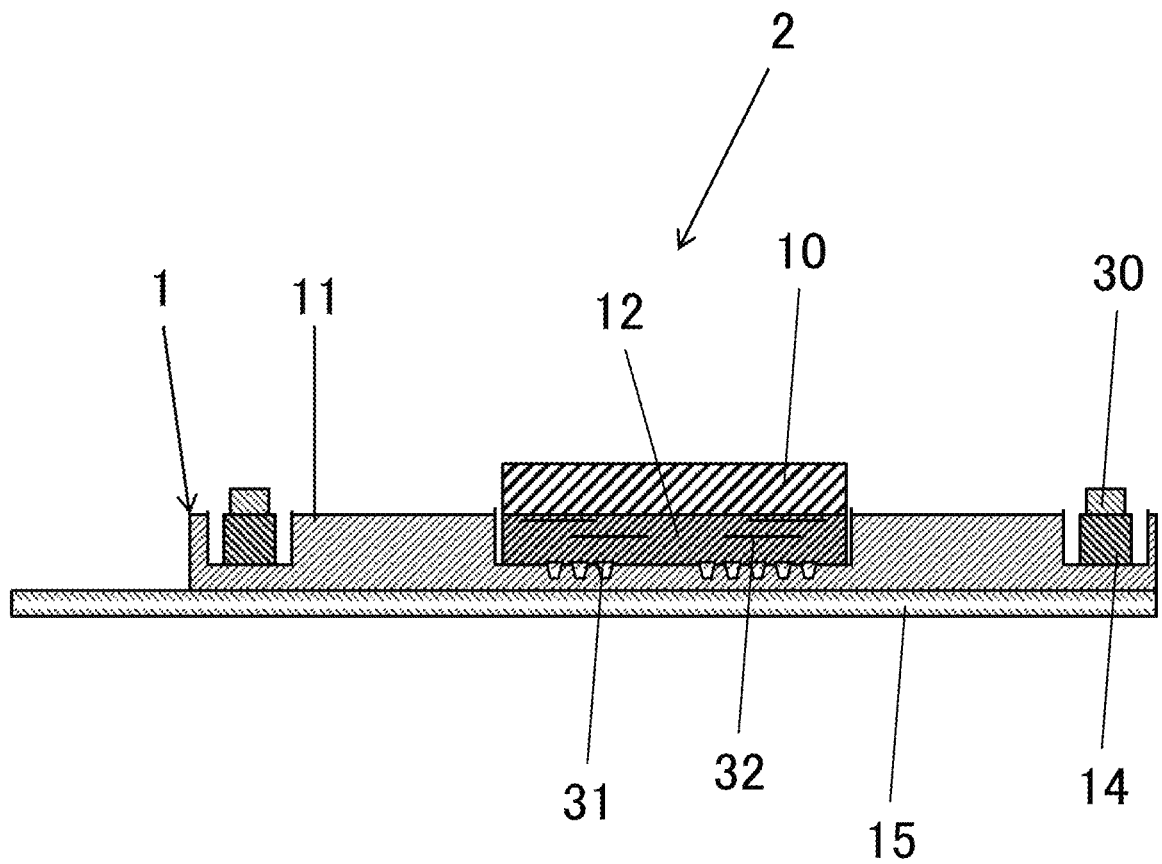
FIG. 3 is a cross-sectional view of the imaging device according to the embodiment of the present invention.
Figure 4:
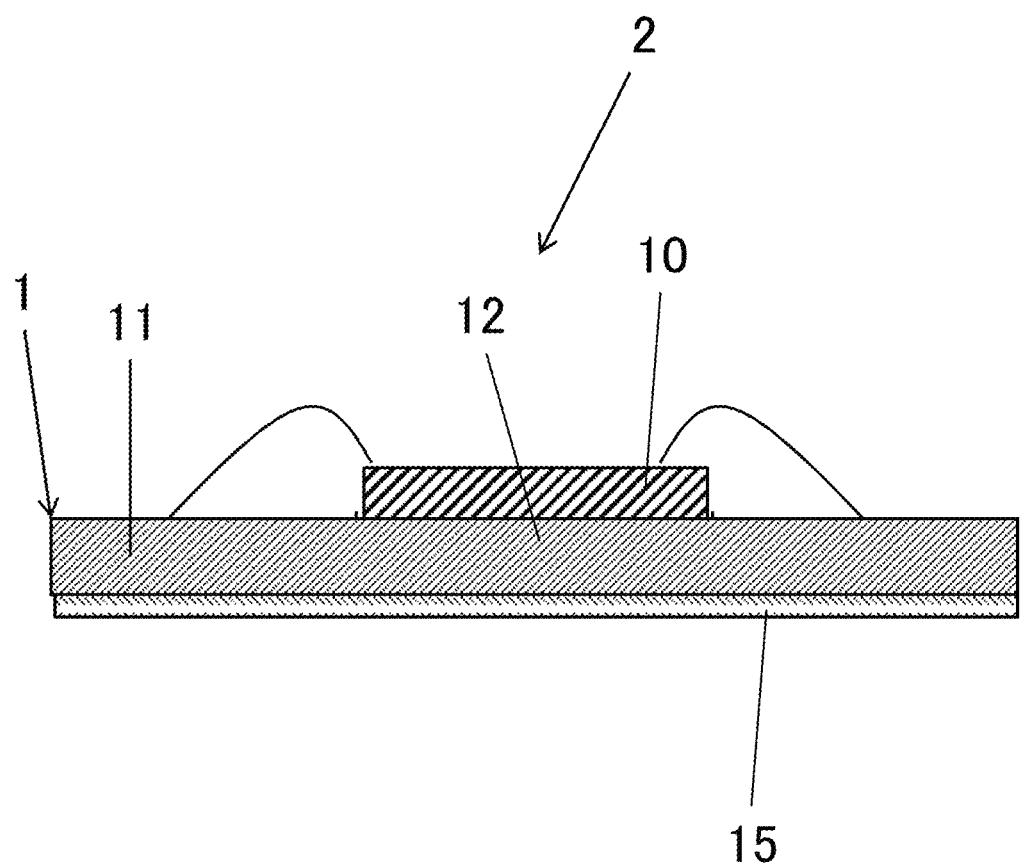
FIG. 4 is a cross-sectional view of the imaging device according to the embodiment of the present invention.
Figure 5:
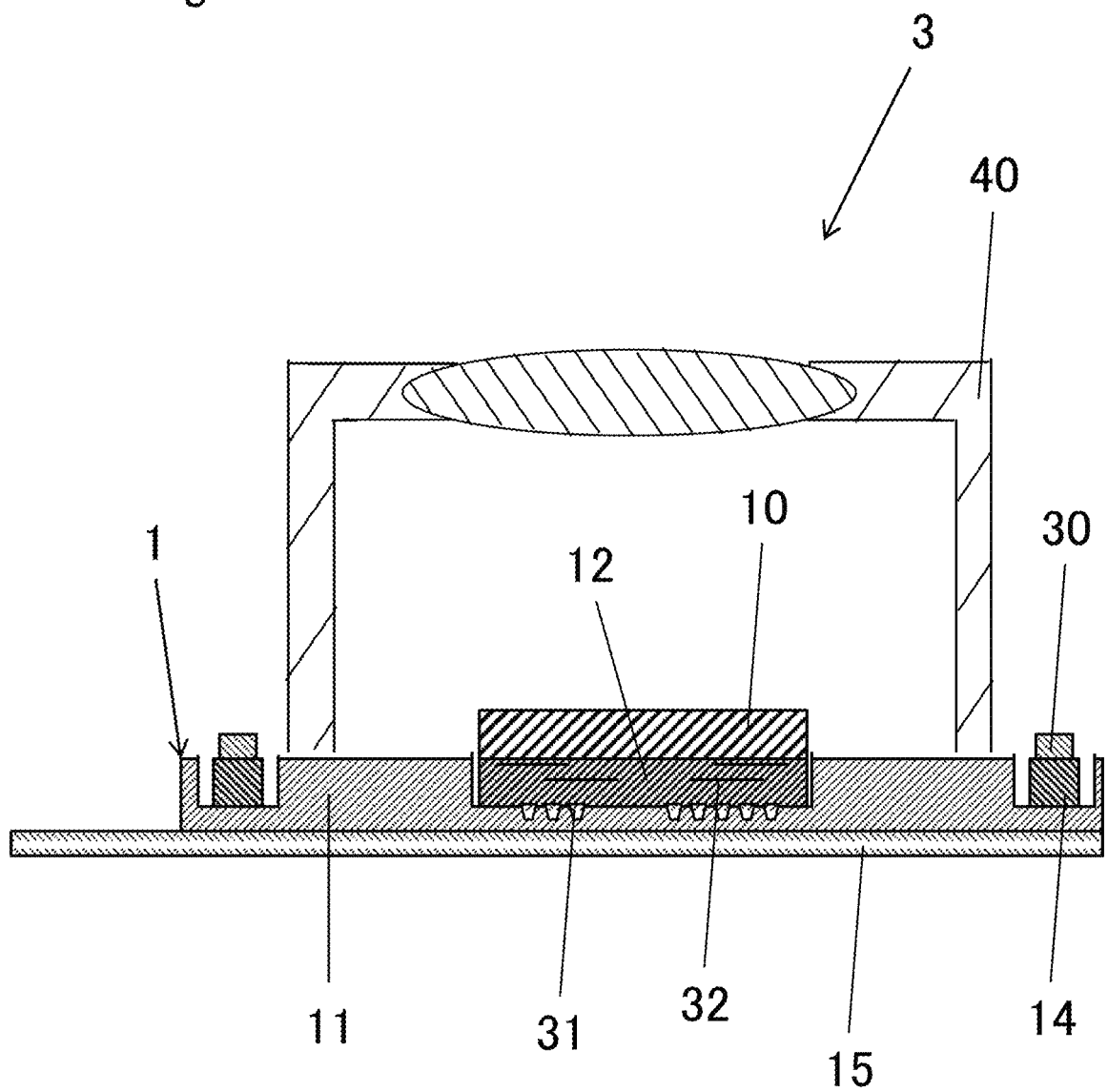
FIG. 5 is a cross-sectional view of an imaging module according to an embodiment of the present invention.
Figure 6:
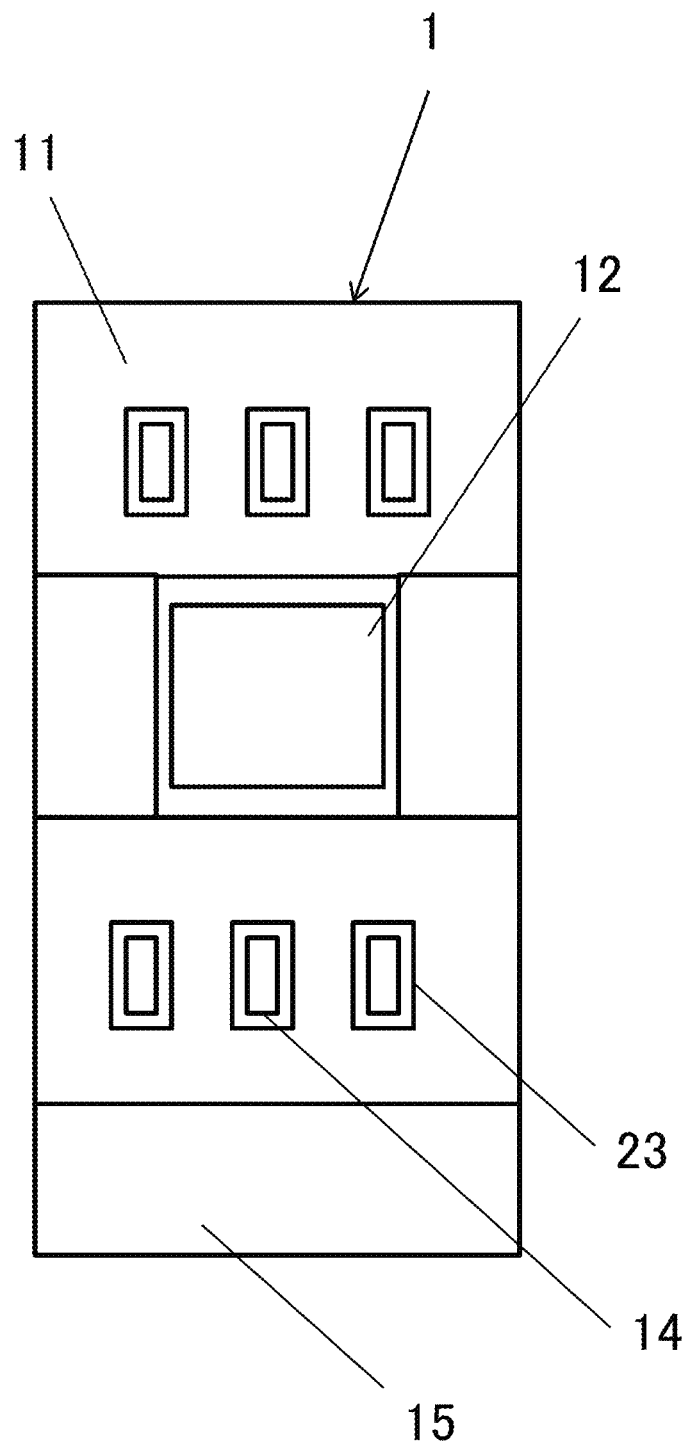
FIG. 6 is a top view of an image sensor mounting board according to an embodiment of the present invention.
Figure 7:
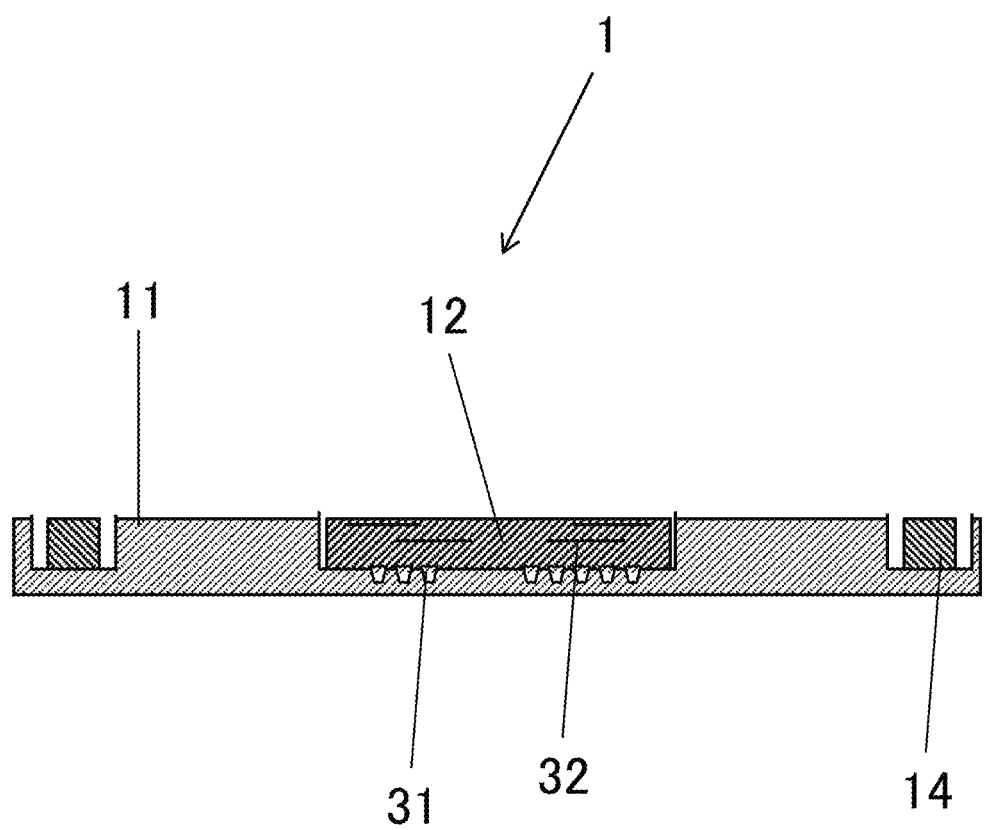
FIG. 7 is a cross-sectional view of the image sensor mounting board according to the embodiment of the present invention.
Figure 8:
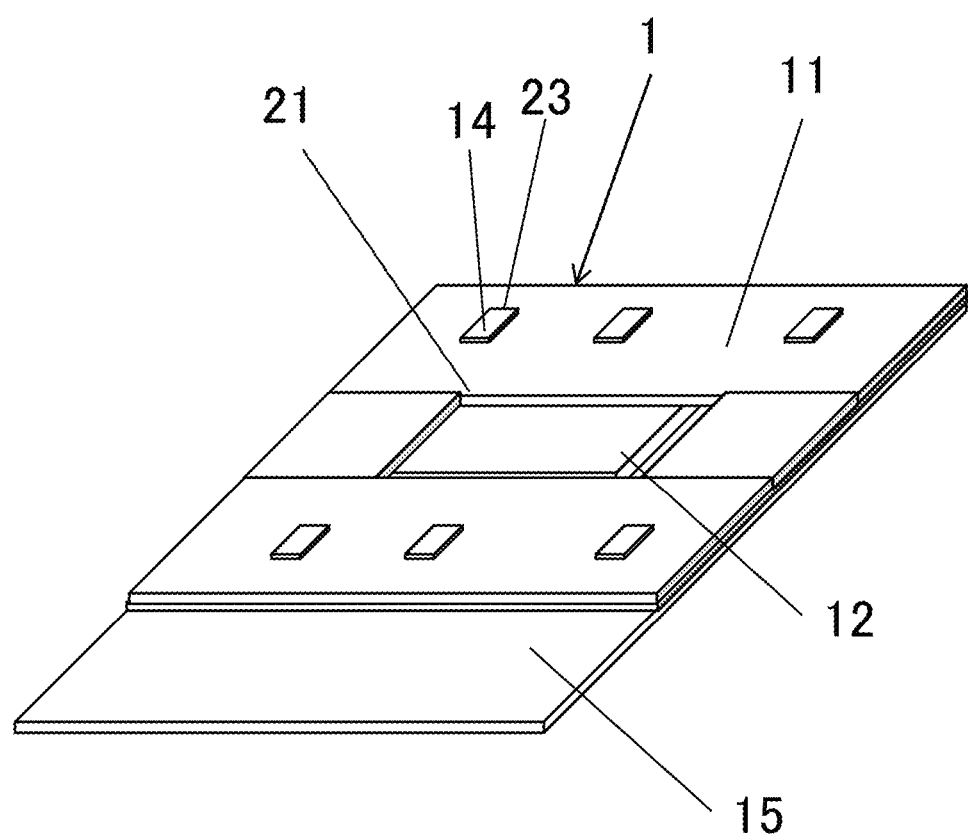
FIG. 8 is a perspective view of the image sensor mounting board according to the embodiment of the present invention.
Figure 9:
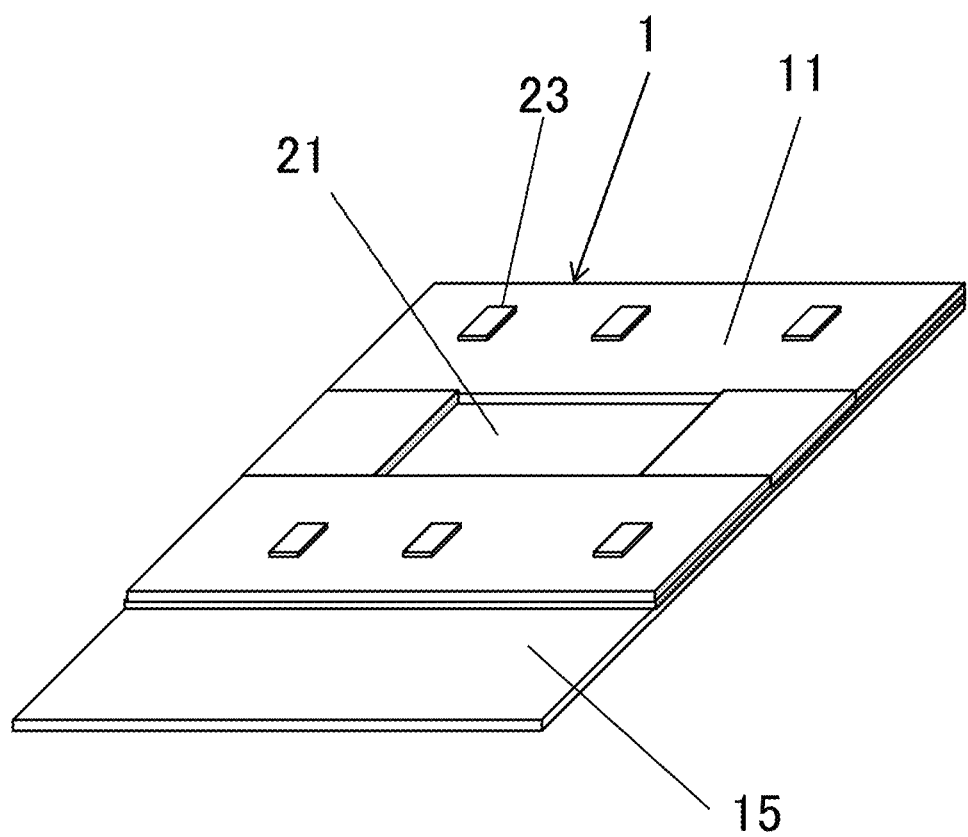
FIG. 9 is a perspective view of the image sensor mounting board (without a second substrate) according to the embodiment of the present invention.
Figure 10A:
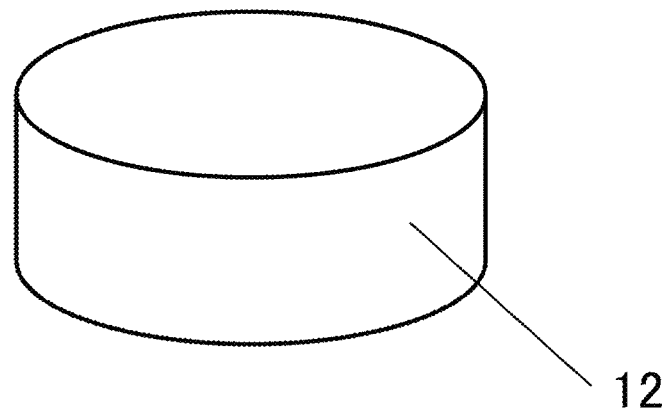
FIGS. 10A to 10C are perspective views of second substrates for an image sensor mounting board according to embodiments of the present invention.
Figure 10B:
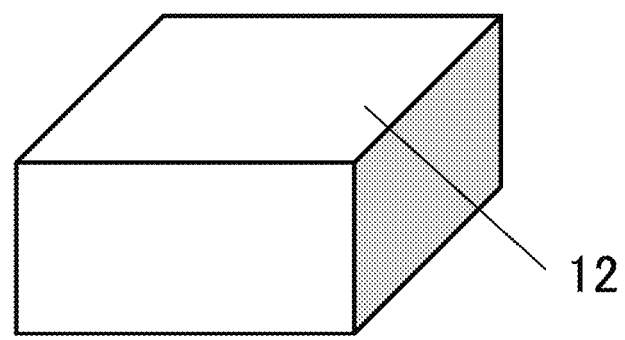
Figure 10C:
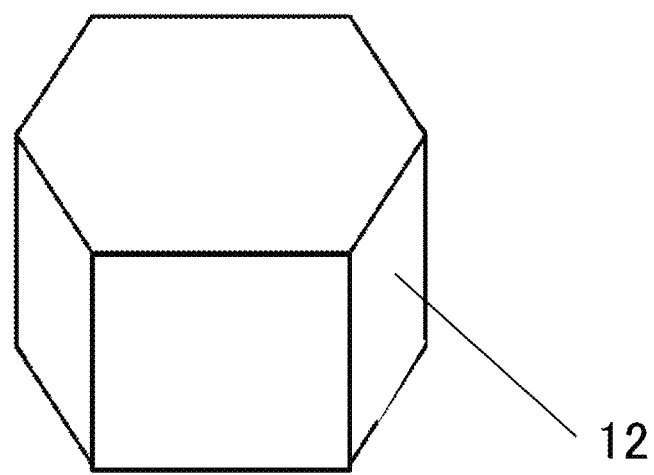

FIG. 1 is a perspective view of an imaging device according to an embodiment of the present invention. FIG. 2 is a top view of the imaging device according to the embodiment of the present invention. FIG. 3 is a cross-sectional view of the imaging device according to the embodiment of the present invention. FIG. 4 is a cross-sectional view of the imaging device according to the embodiment of the present invention. FIG. 5 is a cross-sectional view of an imaging module according to an embodiment of the present invention. FIG. 6 is a top view of an image sensor mounting board according to an embodiment of the present invention. FIG. 7 is a cross-sectional view of the image sensor mounting board according to the embodiment of the present invention. FIG. 8 is a perspective view of the image sensor mounting board according to the embodiment of the present invention. FIG. 9 is a perspective view of the image sensor mounting board (without a second substrate) according to the embodiment of the present invention. FIGS. 10A to 10C are perspective views of second substrates for an image sensor mounting board according to embodiments of the present invention.

In these figures, an imaging module 3 includes an imaging device 2 and a housing 40. The imaging device 2 includes an image sensor mounting board 1 and an image sensor 10. The image sensor mounting board 1 includes a first substrate 11 and a second substrate 12.

The first substrate 11 contains an organic material. The first substrate 11 excluding wiring may be entirely formed from an organic material. The second substrate 12 may be formed from an inorganic material. Examples of the organic material contained in the first substrate 11 include a thermoplastic resin, an epoxy resin, a polyimide resin, an acryl resin, a phenolic resin, and a fluorine-based resin. An example of the fluorine-based resin includes a polytetrafluoroethylene resin. These synthetic resins may contain, for example, glass fibers, glass cloth, or a filler such as oxide particles to provide intended mechanical strength. In one example, a liquid crystal polymer may be used. Liquid crystal polymers have lower hygroscopicity than polyimide and other materials. In other words, liquid crystal polymers do not absorb moisture easily.

The first substrate 11 is, for example, quadrangular in a top view and has dimensions of 10×10 mm to 20×15 mm. The first substrate 11, which is quadrangular in a top view, may be square or rectangular. In a side view, the first substrate 11 has a thickness of, for example, at least 0.2 mm.

The first substrate 11 has a recess 21 on the upper surface. The recess 21 may be quadrangular in a top view or may be polygonal, circular, or oval, other than being quadrangular. When the recess 21 is quadrangular in a top view, the dimensions are 6×5 mm to 15×14 mm. When the recess 21 is circular, the diameter is 8 to 21 mm. The recess 21 has a depth of 0.15 to 0.3 mm. The recess 21 on the first substrate 11 may have a step in a cross-sectional view defined by openings with different sizes.

The second substrate 12 is located in the recess 21 on the first substrate 11. The second substrate 12 has, on its upper surface, a mount area on which the image sensor 10 (described later) is mounted. The second substrate 12 contains an inorganic material. The second substrate 12 excluding wiring may be entirely formed from an inorganic material. In other words, the second substrate 12 may be formed from an inorganic material. An example of the inorganic material contained in the second substrate 12 includes an electrical insulating ceramic material. Examples of the electrical insulating ceramic material include sintered aluminum oxide, sintered mullite, sintered silicon carbide, sintered aluminum nitride, sintered silicon nitride, and sintered glass ceramic.

The second substrate 12 may include a single layer or multiple layers stacked on one another. The second substrate 12 may include six insulating layers, or may include five or less or seven or more insulating layers. The use of five or less layers reduces the thickness of the image sensor mounting board 1. The use of six or more layers increases the rigidity of the image sensor mounting board 1 and can reduce thermal deformation of the first substrate 11.

The second substrate 12 may be quadrangular in a top view or may be polygonal, circular, or oval, other than being quadrangular. When the second substrate 12 is quadrangular in a top view, the dimensions are 4×3 mm to 13×12 mm. When the second substrate 12 is circular, the diameter is 6 to 19 mm. The second substrate 12 has a thickness of at least 0.1 mm. The second substrate 12 may have the same shape as or a different shape from the recess 21 in a top view.

The image sensor mounting board 1 according to embodiments of the present invention has the above structure to reduce thermal deformation of the first substrate 11. The first substrate 11 contains an organic material and may deform easily under heat generated, for example, during use of the image sensor 10 mounted on the upper surface of the first substrate 11 or when the image sensor 10 is mounted. Such deformation may cause misalignment of the optical axis aligned with light entering the image sensor 10. The first substrate 11 may thus have the recess 21 to receive the second substrate 12 containing an inorganic material. The image sensor 10 may be mounted on the upper surface of the second substrate 12. The second substrate 12 can thus reduce warping of the first substrate 11 under heat generated during, for example, the use and mounting of the image sensor 10. Also, the first substrate 11 does not directly receive heat, and is thus less deformable and less likely to cause misalignment of the optical axis.

Although the mounting process is performed at about 250° C., resins and other organic materials may soften at 250° C. or lower. Thus, substrates formed from an organic material are easily deformable. In contrast, the second substrate 12 containing an inorganic material, such as a ceramic material, is fired at 900 to 1600° C. and is thus highly heat-resistant.

The imaging device 2 according to embodiments of the present invention includes the image sensor mounting board 1 described above and the image sensor 10 mounted on the upper surface of the second substrate 12. The second substrate 12 can thus reduce warping of the first substrate 11 under heat generated during, for example, the use and mounting of the image sensor 10. Also, the first substrate 11 does not directly receive heat, and is thus less deformable and less likely to cause misalignment of the optical axis.

The imaging module 3 according to embodiments of the present invention includes the imaging device 2 described above and the housing 40 located at the upper surface of the imaging device 2. The second substrate 12 can thus reduce warping of the first substrate 11 under heat generated during, for example, the use and mounting of the image sensor 10. Also, the first substrate 11 does not directly receive heat, and is thus less deformable and less likely to cause misalignment of the optical axis.

Figure 11:
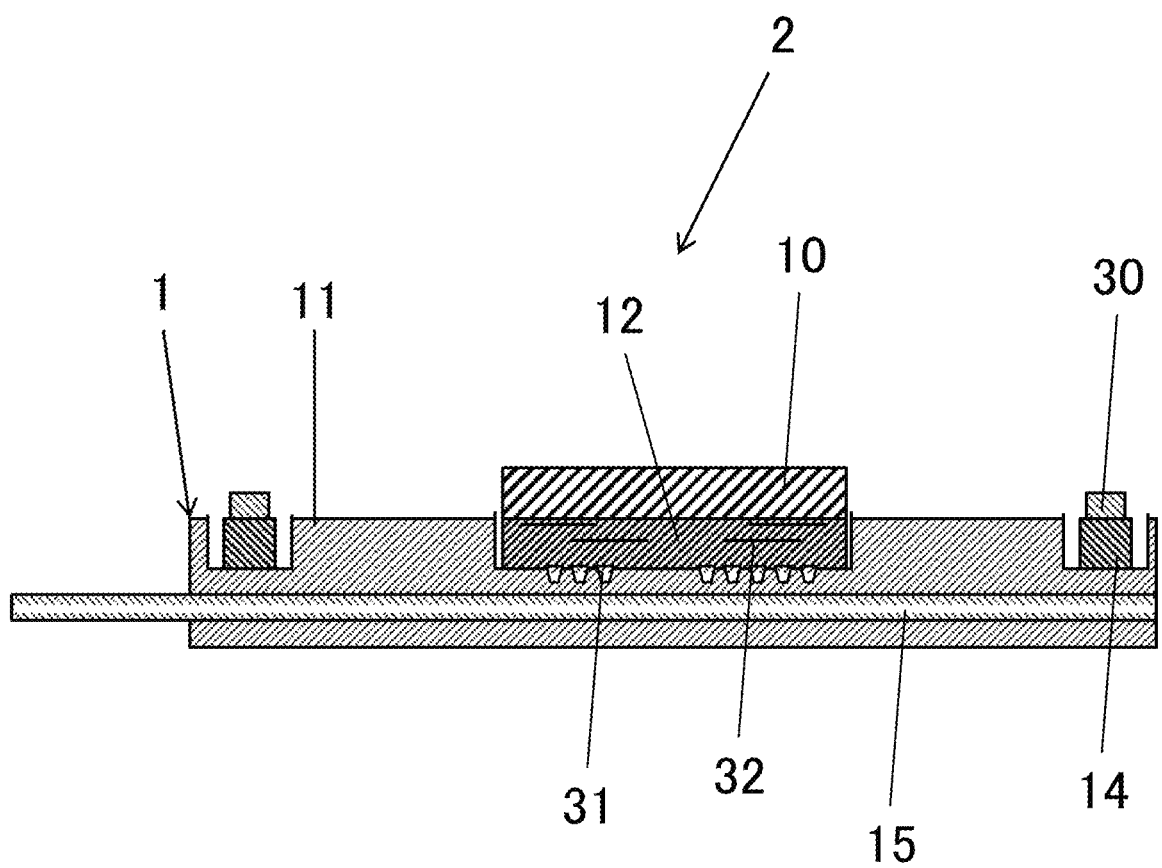
FIG. 11 is a cross-sectional view of an imaging device according to another embodiment of the present invention.
Figure 12:
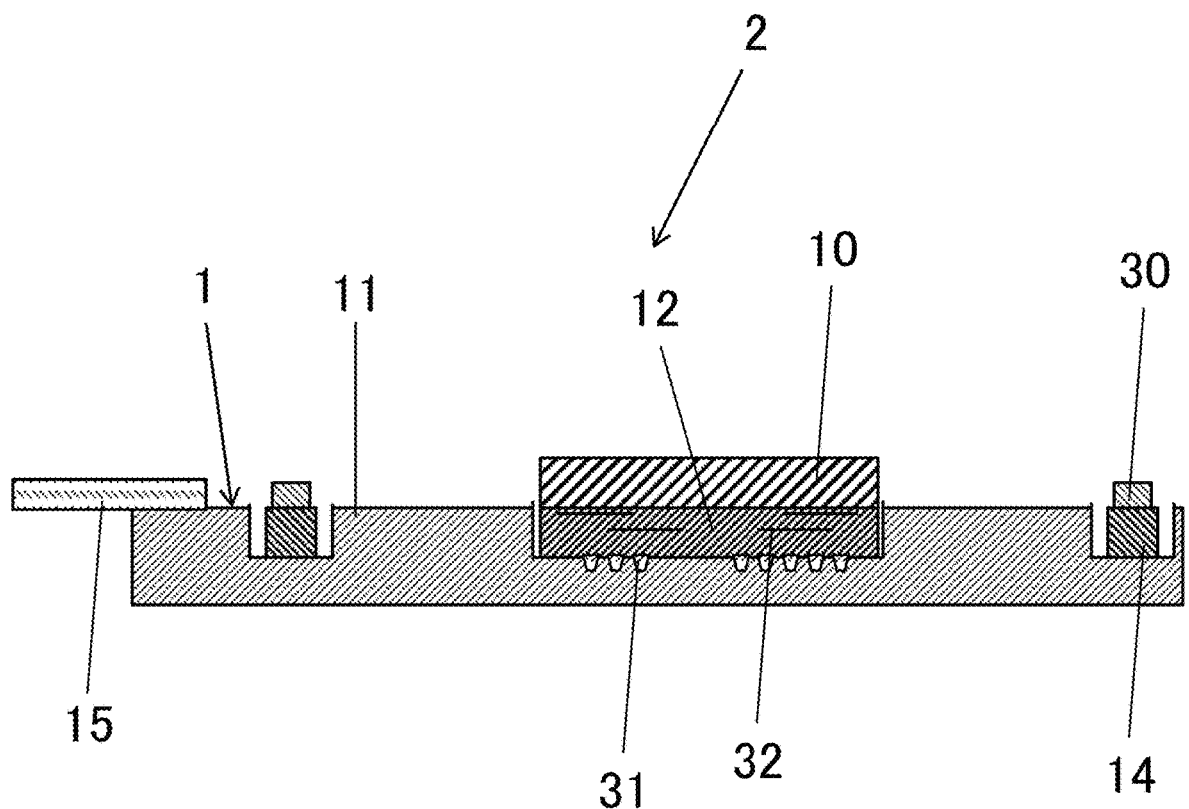
FIG. 12 is a cross-sectional view of an imaging device according to another embodiment of the present invention.
Figure 13:
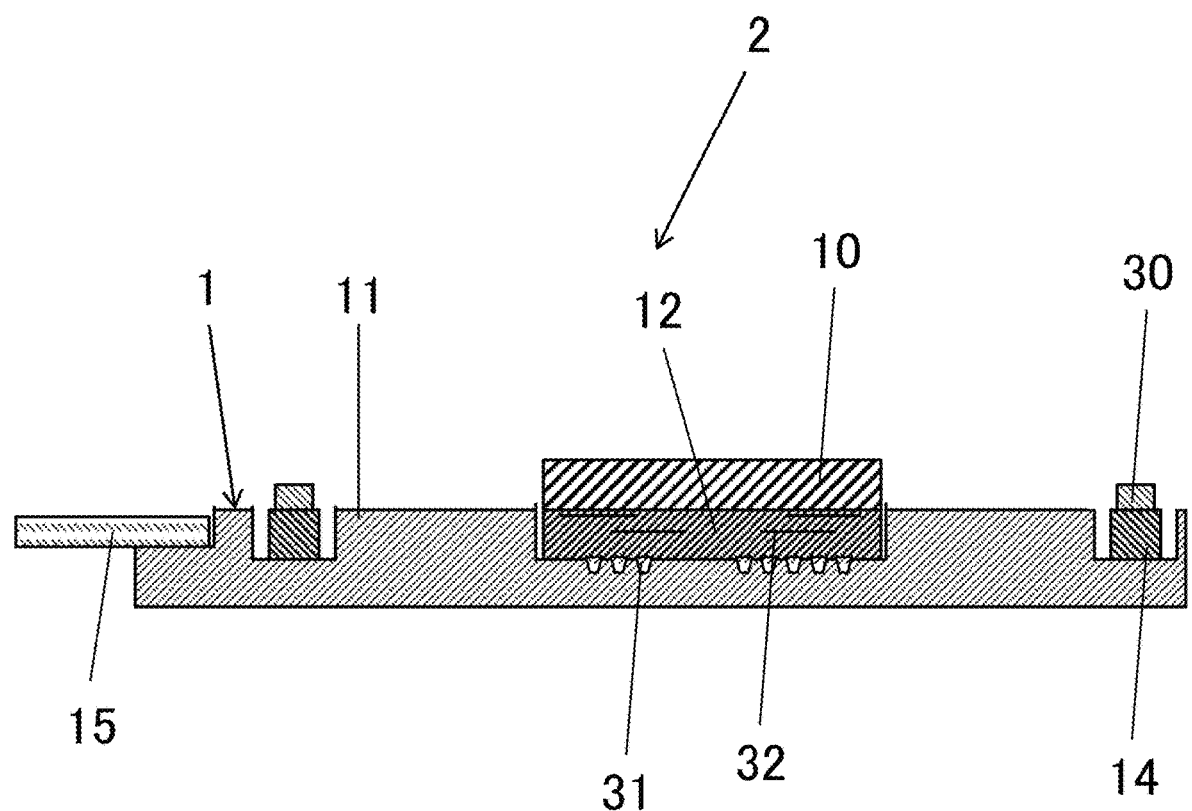
FIG. 13 is a cross-sectional view of an imaging device according to another embodiment of the present invention.
Figure 14:
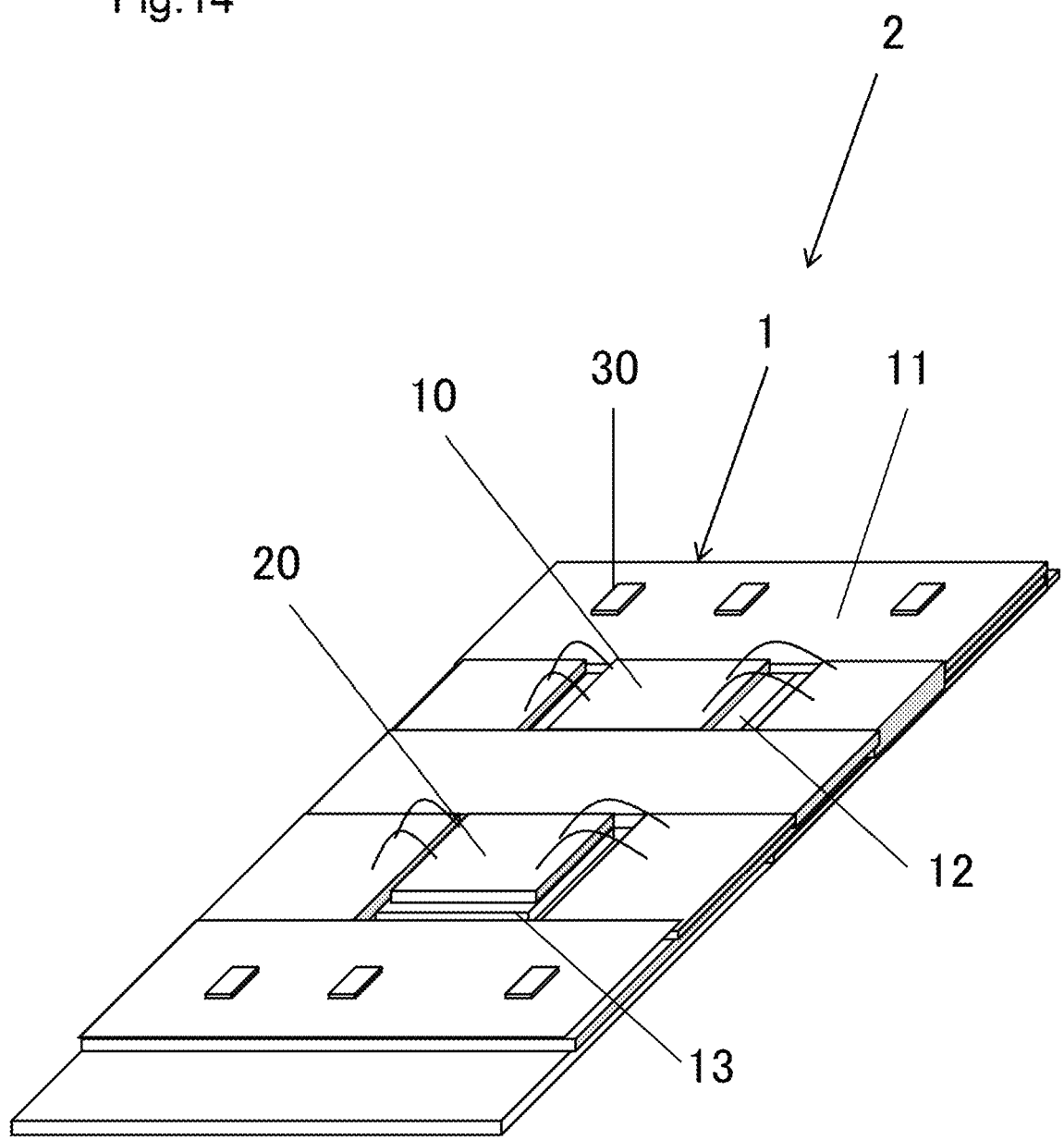
FIG. 14 is a perspective view of an imaging device according to another embodiment of the present invention.
Figure 15:
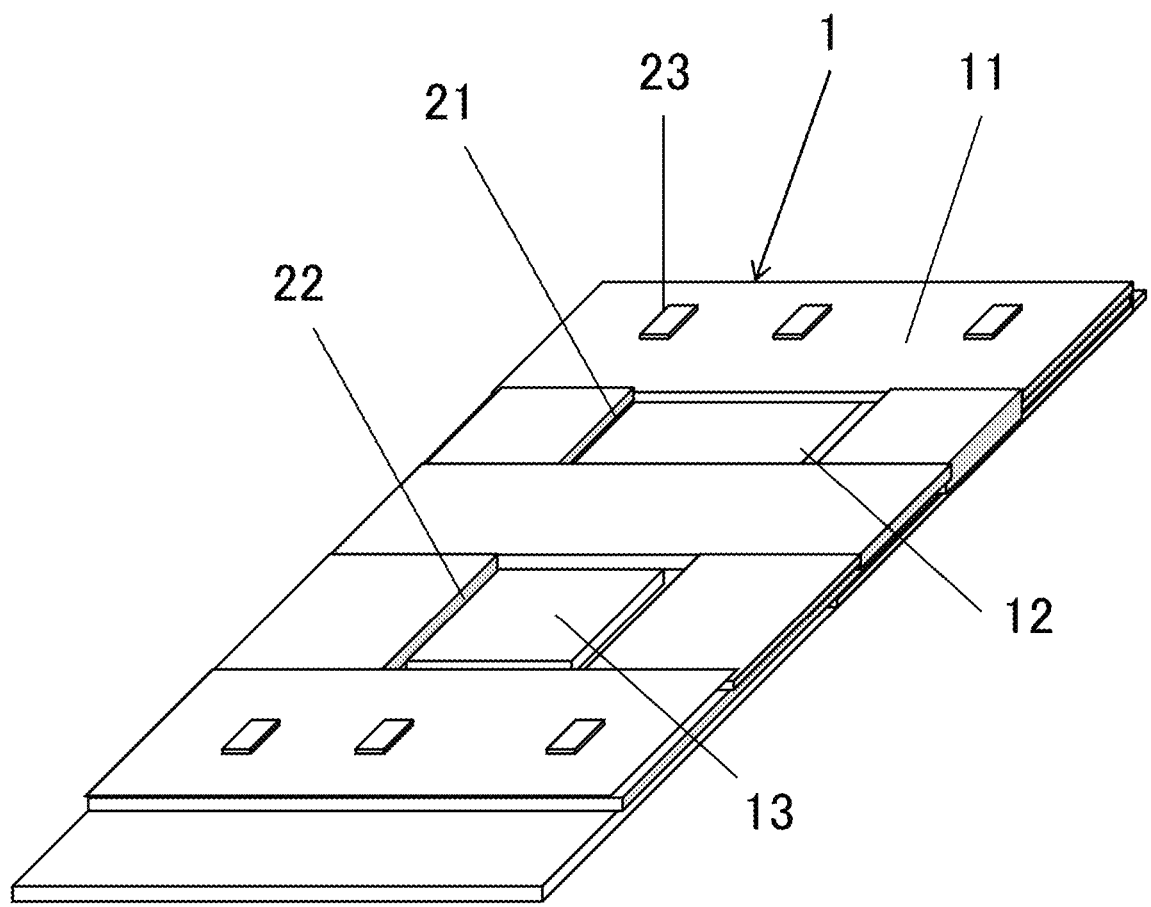
FIG. 15 is a perspective view of an image sensor mounting board according to another embodiment of the present invention.
Figure 16:
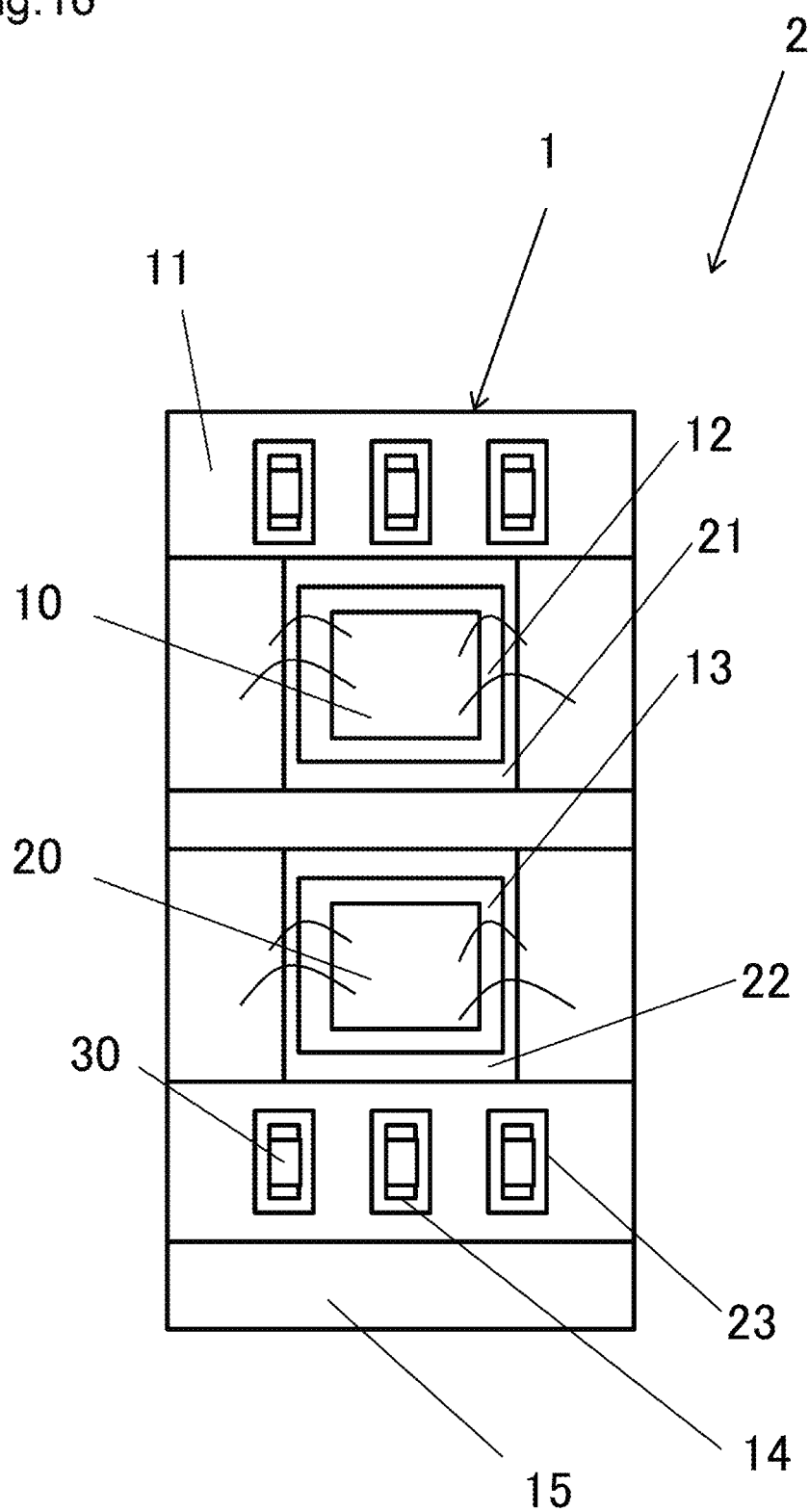
FIG. 16 is a top view of an imaging device according to another embodiment of the present invention.
Figure 17:
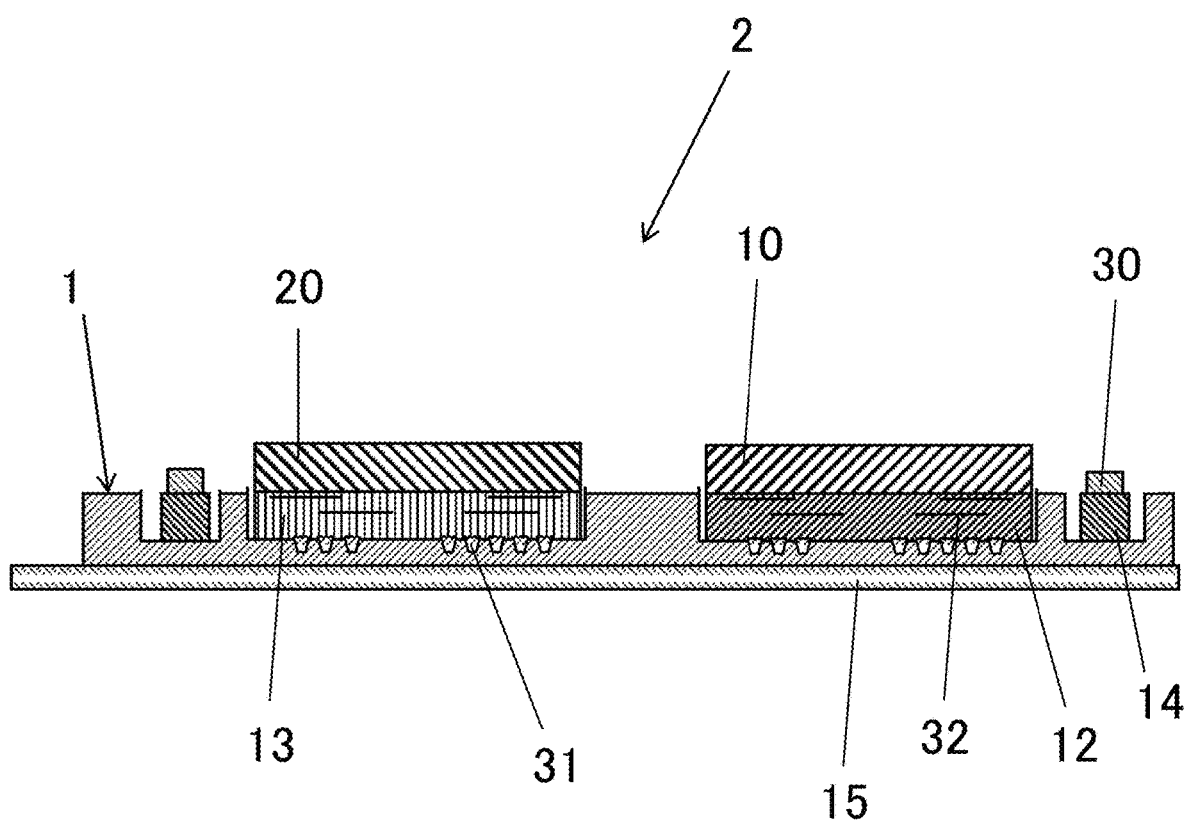
FIG. 17 is a cross-sectional view of an imaging device according to another embodiment of the present invention.
Figure 18:
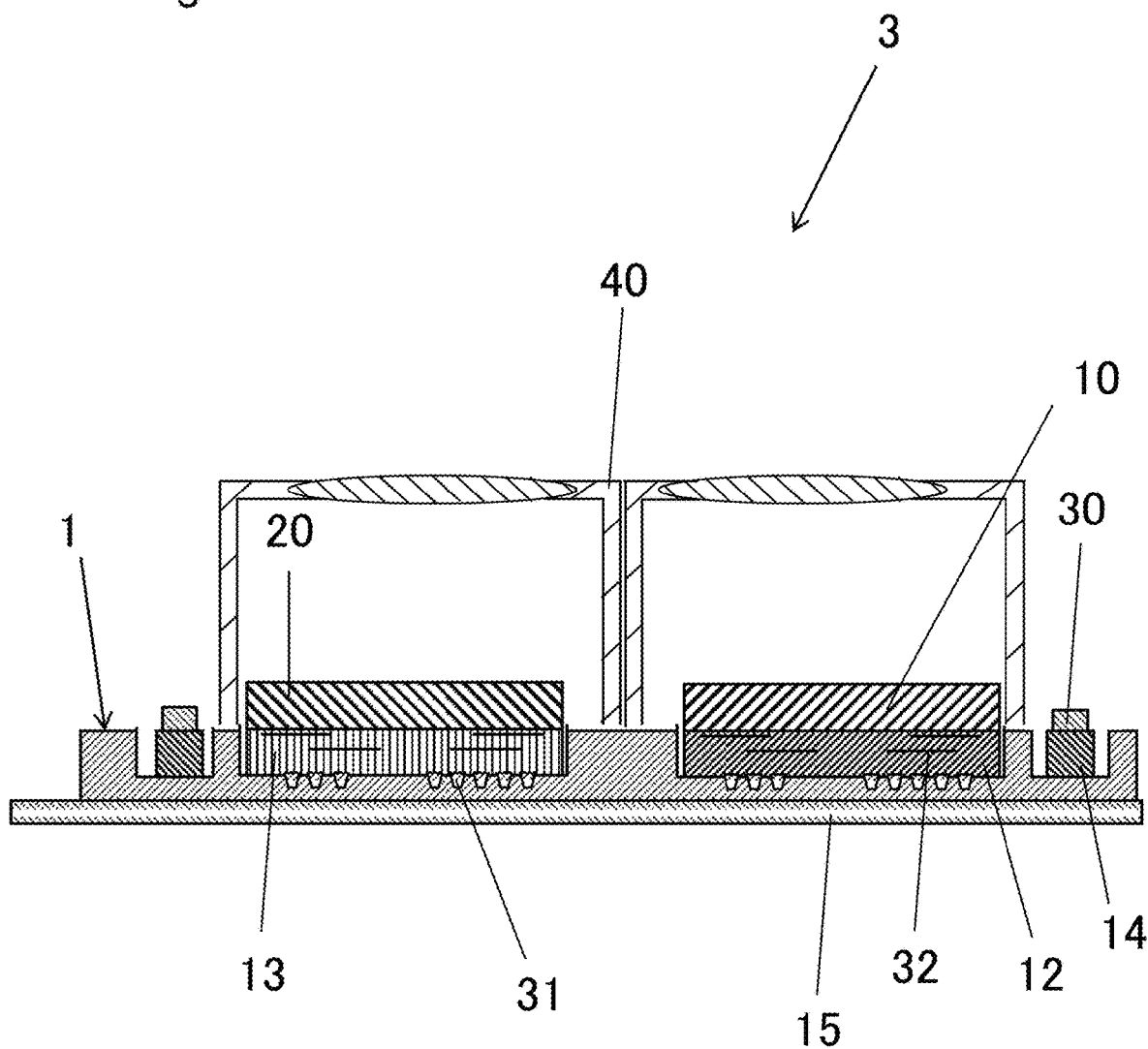
FIG. 18 is a cross-sectional view of an imaging module according to another embodiment of the present invention.

An image sensor mounting board 1, an imaging device 2, and an imaging module 3 according to another embodiment of the present invention may have the structure described below, rather than the structure described above, may have some of the above components including the structures described below, or may include other components in addition to the components described above. These structures will now be described with reference to the drawings. FIG. 11 is a cross-sectional view of an imaging device according to another embodiment of the present invention. FIG. 12 is a cross-sectional view of an imaging device according to another embodiment of the present invention. FIG. 13 is a cross-sectional view of an imaging device according to another embodiment of the present invention. FIG. 14 is a perspective view of an imaging device according to another embodiment of the present invention. FIG. 15 is a perspective view of an image sensor mounting board according to another embodiment of the present invention. FIG. 16 is a top view of an imaging device according to another embodiment of the present invention. FIG. 17 is a cross-sectional view of an imaging device according to another embodiment of the present invention. FIG. 18 is a cross-sectional view of an imaging module according to another embodiment of the present invention. In the same manner as in the embodiment of the present invention described above, the image sensor mounting board 1 includes a first substrate 11 and a second substrate 12. The imaging device 2 includes an image sensor 10. The imaging module 3 includes a housing 40.

In the image sensor mounting board 1 according to another embodiment of the present invention, the second substrate 12 may be located in a recess 21. More specifically, the second substrate 12 may have an upper end placed within the recess 21 in a cross-sectional view. This structure reduces deformation of the first substrate 11 and also reduces the height of the image sensor mounting board 1.

In the image sensor mounting board 1 according to another embodiment of the present invention, the second substrate 12 may be partially located in the recess 21. More specifically, in a cross-sectional view, the second substrate 12 may have an upper surface above the upper end of the first substrate 11 or partially protrude from the recess 21. This structure reduces deformation of the first substrate 11 and also improves mountability of the image sensor 10.

In the image sensor mounting board 1 according to another embodiment of the present invention, the second substrate 12 may have the thickness that is the same as the depth of the recess 21. More specifically, the second substrate 12 may have an upper surface flush with the upper surface of the first substrate 11 in a cross-sectional view. This structure reduces deformation of the first substrate 11 and also reduces irregularities on the upper surface of the image sensor mounting board 1.

In the image sensor mounting board 1 according to another embodiment of the present invention, the recess 21 may have inner surfaces spaced from the side surfaces of the second substrate 12. More specifically, a clearance may be defined between the inner surfaces of the recess 21 and the side surfaces of the second substrate 12. The clearance can reduce pressure from the second substrate 12 to the first substrate 11 when the second substrate 12 is thermally expanded by heat generated during mounting or during use of the image sensor 10. The clearance also reduces transfer of heat from the image sensor 10 or other components to the first substrate 11.

In the image sensor mounting board 1 according to another embodiment of the present invention, the first substrate 11 and the second substrate 12 each have the thickness described above. The second substrate 12 may be thicker than a portion of the first substrate 11 overlapping the second substrate 12 (overlapping the recess 21). This structure allows the second substrate 12 to easily reduce warping of the first substrate 11 that is likely to warp.

In the image sensor mounting board 1 according to another embodiment of the present invention, the first substrate 11 includes multiple via conductors 31 in the portion overlapping the second substrate 12 (overlapping the recess 21). The via conductors 31 electrically connect the first substrate 11 to the second substrate 12. The via conductors 31 are electrically conductive and contain, for example, metal. The first substrate 11 including the via conductors 31 in the portion overlapping the recess 21 can be easily electrically connected to the second substrate 12 in a reliable manner.

The image sensor mounting board 1 according to another embodiment of the present invention may further include a flexible board 15 located on the lower surface of the first substrate 11. The flexible board 15 allows electrical connection with other electronic components and wiring boards in a flexible manner. The flexible board 15 may contain a material such as polyimide. The flexible board 15 is, for example, quadrangular in a top view and has dimensions of 10×10 mm to 20×15 mm. The flexible board 15, which may be located on the lower surface of the first substrate 11 as described above, may be located within the first substrate 11 or on the upper surface of the first substrate 11. The flexible board 15 may be located appropriately in accordance with the connection state to other components and wiring boards.

The image sensor mounting board 1 according to another embodiment of the present invention may have recessed portions 23 in the upper surface. The image sensor mounting board 1 may include mounting substrates 14 located in the recessed portions 23. The mounting substrates 14 contain an inorganic material. Each mounting substrate 14 has, on its upper surface, an electronic component mount area on which an electronic component 30 is mounted. The electronic component 30 also generates heat during use and mounting. The electronic component 30 is mounted on the upper surface of the mounting substrate 14 containing an inorganic material. The mounting substrate 14 can thus reduce warping of the first substrate 11 under heat generated by the electronic component 30 during, for example, use and mounting. Also, the first substrate 11 does not directly receive heat and is thus less deformable.

The image sensor mounting board 1 according to another embodiment of the present invention may have a second recess 22 on the upper surface. The image sensor mounting board 1 may include a third substrate 13 containing an inorganic material located in the second recess 22. The third substrate 13 has, on its upper surface, a second mount area on which a second image sensor 20 is mounted. The second image sensor 20 also generates heat during use and mounting. The second image sensor 20 is mounted on the upper surface of the third substrate 13 containing an inorganic material. The third substrate 13 can thus reduce warping of the first substrate 11 under heat generated by the second image sensor 20 during use and mounting. Also, the first substrate 11 does not directly receive heat and is thus less deformable. For the image sensor mounting board 1 including the second recess 22 and the third substrate 13, the recess 21 described above may be referred to as a first recess 21 and the image sensor 10 may be referred to as a first image sensor 10.

In the image sensor mounting board 1 according to another embodiment of the present invention, the third substrate 13 may be thicker or thinner than the second substrate 12. This structure enables image capturing with two focal points using two cameras.

In the image sensor mounting board 1 according to another embodiment of the present invention, the first substrate 11 may include component pads on the upper surface. The first substrate 11 in the image sensor mounting board 1 may include, on the upper surface, electrode pads for connection with, for example, the image sensor 10. The first substrate 11 may include electrodes for connection to external circuits on its upper surface, side surfaces, or lower surface. The electrodes for connection to external circuits may electrically connect the first substrate 11 or the imaging device 2 to external circuit boards.

The electrode pads, the component pads, the via conductors 31, the electrodes for connection to external circuits, inner wire conductors 32, and other components are formed from, for example, copper (Cu), gold, (Au), aluminum (Al), nickel, (Ni), molybdenum (Mo), or titanium (Ti), or an alloy containing one or more of these metals. Wires on the second substrate 12 are formed from, for example, tungsten (W), molybdenum (Mo), manganese (Mn), silver (Ag), or copper (Cu), or an alloy containing one or more of these metals. The wires may be formed from copper.

Uncovered surfaces of the electrode pads, the component pads, the via conductors 31, the electrodes for connection to external circuits, the inner wire conductors 32, and other components may be plated. The plating layer protects the uncovered surfaces of the pads, the electrodes for connection to external circuits, the conductors, and the via conductors against oxidation. The plating layer also allows reliable electrical connection between the electrode pads and the image sensor with image sensor connectors, such as bonding wires. The plating layer may be, for example, a Ni plating layer with a thickness of 0.5 to 10 μm, and the Ni plating layer may further be coated with a gold (Au) plating layer with a thickness of 0.5 to 3 µm. Structure of Imaging Device FIGS. 1 to 4, FIGS. 11 to 14, and FIGS. 16 and 17 show examples of the imaging device 2. The imaging device 2 includes the image sensor mounting board 1 and the image sensor (first image sensor) 10 mounted on the image sensor mounting board 1. The imaging device 2 may further include the second image sensor 20 in another embodiment. Each of the image sensor 10 and the second image sensor 20 is, for example, a complementary metal-oxide semiconductor (CMOS) device or a charge-coupled device (CCD). The image sensor 10 may be mounted on the upper surface of the second substrate 12 with an adhesive. The image sensor 20 may be mounted on the upper surface of the third substrate 13 with an adhesive. The adhesive is, for example, silver epoxy or a thermosetting resin. The image sensor 10 and the second image sensor 20 may be the same sensor or different sensors.

The imaging device 2 may include a lid bonded to the upper surface of the image sensor mounting board 1 to cover the image sensor 10. In another embodiment, the lid may further cover the second image sensor 20. The image sensor mounting board 1 may have the lid connected to the upper surface of a frame portion in the first substrate 11 or include a frame that supports the lid and surrounds the image sensor 10 (and the second image sensor 20) on the upper surface of the first substrate 11. The frame and the first substrate 11 may be formed from the same material or different materials.

When the frame and the first substrate 11 are formed from the same material, they may be formed integrally with the uppermost insulating layer by, for example, forming the frame opening in the first substrate 11. In another example, the frame and the first substrate 11 may be bonded together with a separately prepared brazing material.

When the first substrate 11 and the frame are formed from different materials, the frame may be formed from, for example, the same material as the material for a lid bond for bonding the lid to the first substrate 11. In this case, the lid bond is thick enough to function both as a bonding member and a frame (as a support for the lid). Examples of the lid bond include a thermosetting resin and a brazing material formed from glass with a low melting point or a metal component. The frame and the lid may be formed from the same material. In this case, the frame and the lid may be formed as one piece.

The lid may be formed from a highly transparent material, such as a glass material, to cover the image sensor such a CMOS or CCD. The lid is bonded to the image sensor mounting board 1 with the lid bond. Examples of the material for the lid bond include a thermosetting resin and a brazing material formed from glass with a low melting point or a metal component.

Structure of Imaging Module

The imaging module 3 includes the imaging device 2, the electronic components 30 mounted on the mounting substrates 14, and a housing 40 located at the upper surface of the imaging device 2. The imaging module will now be described as an example.

The imaging module 3 may include the housing 40 (lens holder). The housing 40 improves hermetical sealing and reduces external stress directly applied to the imaging device 2. The housing 40 is formed from, for example, a resin or metal material. The lens holder as the housing 40 may incorporate one or more lenses formed from, for example, a resin, a liquid, glass, or quartz. The housing 40 may include, for example, a drive for vertical or horizontal driving and may be electrically connected to, for example, the pads on the image sensor mounting board 1 with a bond such as solder.

The housing 40 may be located at the upper surface of the imaging device 2 or may cover the imaging device 2 and the electronic components 30 together. In some embodiments, different housings 40 may each be located at the upper surface of the imaging device 2 or the upper surfaces of the electronic components 30.

The housing 40 may have an opening in at least one of the four sides in a top view. Through the opening in the housing 40, an external circuit board may be placed for electrical connection to the image sensor mounting board 1. After the external circuit board is electrically connected to the image sensor mounting board 1, the opening in the housing 40 may be sealed with a sealant, such as a resin, to hermetically seal the inside of the imaging module 3.

The imaging module 3 includes the electronic components 30 mounted on the mounting substrates 14 and electrically connected to the component pads. The electronic components 30 are, for example, passive components including chip capacitors, inductors, and resistors, and active components including optical image stabilizers (OISs), signal processors, gyro sensors, and light-emitting diodes (LEDs). The electronic components 30 may be mounted on the imaging device 2 described above, before the imaging device 2 is formed into the imaging module 3.

The electronic components 30 are connected to the component pads 5 with a bond for electronic components, such as bonding wires, gold bumps, solder, or a conductive resin. The electronic components 30 may be connected to the image sensor 10 with, for example, inner wires in the first substrate 11 and the second substrate 12. When the electronic components 30 are LEDs, the electronic components 30 may be located outside the housing 40 to reduce, for example, flare.

The imaging module 3 including the image sensor mounting board 1 according to any of the embodiments of the present invention can have the first substrate 11 with less warping and thus reduce misalignment of the optical axis. The imaging module can thus be used stably. Method for Manufacturing Image Sensor Mounting Board and Imaging Device An example method for manufacturing the image sensor mounting board 1 and the imaging device 2 according to the embodiments will now be described. The manufacturing method described below uses a multi-piece wiring substrate.

(1) A ceramic green sheet to be the second substrate 12 is prepared first. To obtain the substrate 2 formed from, for example, sintered aluminum oxide ($Al_2O_3$), powders, such as silica ($SiO_2$), magnesia (MgO), or calcium oxide (CaO), are added as sintering aids to $Al_2O_3$ powder, and an appropriate binder, an appropriate solvent, and an appropriate plasticizer are added to the powder mixture, which is then kneaded to form slurry. The slurry is then shaped into a sheet using a doctor blade or by calendaring to obtain a ceramic green sheet for a multi-piece substrate.

The first substrate 11 containing an organic material may be molded using a mold having a predetermined shape by transfer molding or injection molding. The first substrate 11 may be formed from a glass epoxy resin, which is a base glass fiber impregnated with a resin. In this case, the base glass fiber is impregnated with a precursor of an epoxy resin. The epoxy resin precursor is then cured by heat at a predetermined temperature to form the first substrate 11.

(2) A metal paste is then applied or placed, by screen printing and die machining or punching with laser in combination, to the areas to be the inner wire conductors 32 or in through-holes in the ceramic green sheet obtained through the above process (1). The metal paste is prepared by adding an appropriate solvent and an appropriate binder to the metal powder containing the above metal materials and then kneading the mixture to have an appropriate viscosity. The metal paste may contain glass or ceramic to increase the strength of bonding with the second substrate 12. The electrode pads, the component pads, the electrodes for connection to external circuits, the via conductors 31, and the inner wire conductors 32 can be formed by, for example, sputtering or vapor deposition. In some embodiments, these components may be formed by plating after forming a metal film on the surface.

(3) The above green sheet to be the second substrate 12 is then processed using, for example, a die. Through-holes may be formed using a die or by laser processing, and feed-through conductors or other components may be formed with the method described above.

(4) The ceramic green sheets to be the insulating layers are then stacked and pressed to prepare a ceramic green sheet laminate to be the second substrate 12.

(5) This ceramic green sheet laminate is then fired at about 1500 to 1800° C. to obtain a multi-piece wiring substrate including an array of second substrates 12. In this process, the metal paste described above is fired together with the ceramic green sheets to be the second substrate 12 to form the inner wire conductors 32.

(6) The multi-piece wiring substrate resulting from the firing process is then cut into multiple second substrates 12. In this cutting process, separation grooves may be formed along the outer edge of each of the second substrates 12, and the multi-piece wiring substrate may be split along the separation grooves into the multiple second substrates 12. In other embodiments, the multi-piece wiring substrate may be cut along the outer edge of each of the second substrates 12 by, for example, slicing. The separation grooves may be formed to have a depth smaller than the thickness of the multi-piece wiring substrate using a slicer after the firing process. In still other embodiments, the separation grooves may be formed by pressing a cutter blade onto the ceramic green sheet laminate that is to be the multi-piece wiring substrate or by cutting the ceramic green sheet laminate to a depth smaller than its thickness with a slicer. Before or after the multi-piece wiring substrate is split into multiple second substrates 12, the uncovered wiring conductors may be plated by electro-plating or electroless plating.

(7) The second substrate 12 is then fixed in the recess 21 on the first substrate 11 by bonding with, for example, solder. The second substrate 12 may be electrically connected to the via conductors 31 by bonding. This completes the image sensor mounting board 1. The image sensor 10 and the electronic components 30 are then mounted on the image sensor mounting board 1. The image sensor 10 is electrically connected to the image sensor mounting board 1 with image sensor connectors, such as bonding wires. The image sensor 10 may be fixed onto the image sensor mounting board 1 with an adhesive or another bond applied to either the image sensor 10 or the image sensor mounting board 1. The image sensor 10 is fixed onto the upper surface of the second substrate 12. After the image sensor 10 is mounted on the image sensor mounting board 1, the lid may be bonded to the image sensor mounting board 1 with a lid bond. The electronic components 30 are electrically bonded to the image sensor mounting board 1 with an electronic component connector, such as a solder paste.

The imaging device 2 is obtained by fabricating the image sensor mounting board 1 and mounting the image sensor 10 on the image sensor mounting board 1 through the processes (1) to (7). The processes (1) to (7) may be performed in any order.

The present invention is not limited to the examples described in the above embodiments. All the features in the embodiments may be combined unless any contradiction arises. Numerical values and other features may also be modified variously. The via conductors may have the same size or different sizes in a plan view. In the embodiments, any number of electrode pads, component pads, and recessed portions with any shapes may be in any arrangement, and the image sensor may be mounted with any method.

REFERENCE SIGNS LIST 1 image sensor mounting board
2 imaging device
3 imaging module
11 first substrate
12 second substrate
13 third substrate
14 mounting substrate
15 flexible board
21 recess (first recess)
22 second recess
23 recessed portion
31 via conductor
32 inner wire conductor
10 image sensor (first image sensor)
20 second image sensor
30 electronic component
40 housing

The invention claimed is:

1. An image sensor mounting board, comprising:
a first substrate having an upper surface with a recess, the first substrate comprising an organic material; and
a second substrate located in the recess on the first substrate and having an upper surface with a mount area on which an image sensor is mountable, the second substrate comprising an electrical insulating ceramic material,
wherein the first substrate further has a second recess on the upper surface, and the image sensor mounting board further includes a third substrate located in the second recess, the third substrate having an upper surface with a second mount area on which a second image sensor is mountable, the third substrate comprising an inorganic material;
wherein the third substrate is thicker than the second substrate.

2. The image sensor mounting board according to claim 1, wherein
the upper surface of the second substrate is located within the recess in a cross-sectional view.

3. The image sensor mounting board according to claim 1, wherein
the upper surface of the second substrate is located above an upper end of the first substrate in a cross-sectional view.

4. The image sensor mounting board according to claim 1, wherein the recess is quadrangular in a top view.

5. The image sensor mounting board according to claim 1, wherein the recess is circular in a top view.

6. The image sensor mounting board according to claim 1 wherein the recess has inner surfaces spaced from side surfaces of the second substrate.

7. The image sensor mounting board according to claim 1, wherein the second substrate is thicker than a portion of the first substrate overlapping the second substrate.

8. The image sensor mounting board according to claim 1, wherein
the first substrate includes a plurality of via conductors in a portion overlapping the second substrate, and
the via conductors electrically connect the first substrate to the second substrate.

9. The image sensor mounting board according to claim 1, further comprising: a flexible board located on a lower surface of the first substrate.

10. The image sensor mounting board according to claim 1, wherein the first substrate further has a recessed portion in the upper surface, and the image sensor mounting board further includes a mounting substrate located in the recessed portion, the mounting substrate having an upper surface with an electronic component mount area on which an electronic component is mountable, the mounting substrate comprising an inorganic material.

11. An imaging device, comprising: the image sensor mounting board according to claim 10;
an image sensor located on the upper surface of the second substrate included in the image sensor mounting board; and
an electronic component located on the upper surface of the mounting substrate.

12. An imaging device, comprising: the image sensor mounting board according to claim 1; and
an image sensor located on the upper surface of the second substrate included in the image sensor mounting board.

13. An imaging module, comprising: the imaging device according to claim 12; and a housing located at an upper surface of the imaging device.

14. An imaging device, comprising: the image sensor mounting board according to claim 1;
an image sensor located on the upper surface of the second substrate included in the image sensor mounting board; and
a second image sensor located on the upper surface of the third substrate.

15. An image sensor mounting board, comprising:
a first substrate having an upper surface with a recess, the first substrate comprising an organic material; and
a second substrate located in the recess on the first substrate and having an upper surface with a mount area on which an image sensor is mountable, the second substrate comprising an electrical insulating ceramic material;
wherein the first substrate further has a second recess on the upper surface, and the image sensor mounting board further includes a third substrate located in the second recess, the third substrate having an upper surface with a second mount area on which a second image sensor is mountable, the third substrate comprising an inorganic material;
wherein the third substrate is thinner than the second substrate.

* * * * *